United States Patent
Nikitin et al.

(10) Patent No.: US 7,356,743 B2
(45) Date of Patent: Apr. 8, 2008

(54) RRAM CONTROLLER BUILT IN SELF TEST MEMORY

(75) Inventors: Andrey Nikitin, Moscow (RU); Ilya V. Neznanov, Moscow (RU); Alexander Andreev, San Jose, CA (US)

(73) Assignee: LSI Logic Corporation, Milpitas, GA (US)

( * ) Notice: Subject to any disclaimer, the term of this patent is extended or adjusted under 35 U.S.C. 154(b) by 212 days.

(21) Appl. No.: 11/256,829

(22) Filed: Oct. 24, 2005

(65) Prior Publication Data

US 2007/0091702 A1    Apr. 26, 2007

(51) Int. Cl.
*G11C 29/00* (2006.01)

(52) U.S. Cl. .................... 714/719; 714/25; 714/42; 714/718; 714/733; 365/201; 711/101

(58) Field of Classification Search ............... None
See application file for complete search history.

(56) References Cited

U.S. PATENT DOCUMENTS 5,506,959 A * 4/1996 Cockburn ............... 714/42
5,737,767 A * 4/1998 Agrawal et al. ......... 711/171
2006/0200713 A1* 9/2006 Slobodnik et al. ...... 714/718

OTHER PUBLICATIONS

Lizy Kurian John, "VaWiRAM: A Variable Width Random Access Memory Module", Jan. 1996, IEEE 9th Conference on VLSI Design, pp. 219-224.*

* cited by examiner

*Primary Examiner*—John P Trimmings
(74) *Attorney, Agent, or Firm*—Luedeka Neely & Graham

(57) ABSTRACT

An RRAM design having linear BIST memory and rectangular BIST memory, the improvement comprising at least one of the linear BIST memory and the rectangular BIST memory formed only of flipflops and logic cells.

6 Claims, 1 Drawing Sheet

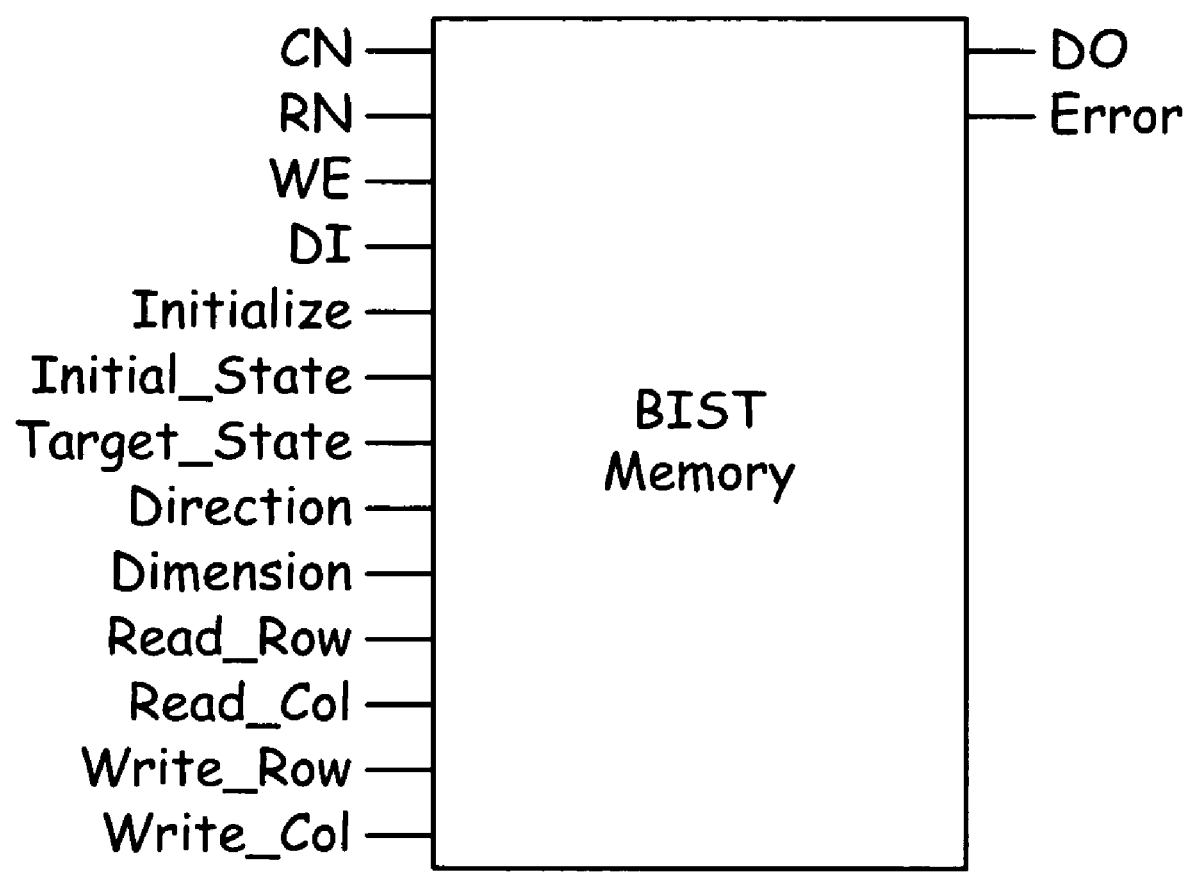

RRAM CONTROLLER BUILT IN SELF TEST MEMORY

FIELD

This invention relates to the field of integrated circuit fabrication. More particularly, this invention relates to a method for defining RRAM BIST modules using only flipflops and logic cells.

BACKGROUND

Integrated circuits are often formed using an application specific integrated circuit architecture, which tends to reduce the design costs of the integrated circuit by using predetermined logic blocks in a somewhat customized arrangement to produce an integrated circuit according to a customer's specifications. One aspect of such a customizable integrated circuit design is referred to as RRAM.

RRAM (Reconfigurable RAM) contains sets of memories of the same type that are placed compactly within a memory matrix. An RRAM, as the term is used herein, is a megacell that can be considered as a set of memories with built-in self testing and built-in self correction. RRAM also contains sets of embedded tools that are used for mapping arbitrary logical customer memory designs to the physical memories in the matrix.

Some integrated circuit designs contain several RRAMs. Each RRAM has special sets of memories of the same type that are placed compactly. RRAMs also have a built-in testing and self-repairing component. The process of testing the memories of RRAMs and self-repairing these memories is managed by the RRAM controller. The present invention is directed to one of the modules of the RRAM controller, called the built in self test (BIST) memory.

SUMMARY

The above and other needs are met by an RRAM design having linear BIST memory and rectangular BIST memory, the improvement comprising at least one of the linear BIST memory and the rectangular BIST memory formed only of flip flops and logic cells.

BRIEF DESCRIPTION OF THE DRAWINGS

Further advantages of the invention are apparent by reference to the detailed description when considered in conjunction with the FIGURE, which is not to scale so as to more clearly show the details, wherein like reference numbers indicate like elements, and which is a input/output diagram of a BIST memory according to a preferred embodiment of the present invention.

DETAILED DESCRIPTION

BIST memory is a special module of the RRAM controller, and is generally depicted in the FIGURE. This module is involved in the processes of the BIST (built in self test) and BISR (built-in self repair). This module can be considered as usual memory that stores bits and provides read and write operations on these bits. All the bits that are stored in the BIST memory are organized as a matrix with a number of columns CN and a number of rows RN. The total number of bits that can be stored in the BIST memory is RN*CN. Numbers RN and CN are not constant, and are defined on the S-bit inputs CN and RN of the BIST memory. The addresses for reading and writing operations are defined by two pairs of S-bit inputs (READ_ROW, READ_COL) and (WRITE_COL, WRITE_ROW). The BIST memory also has 1-bit inputs: WE—write enable, DI—data input for writing, and 1-bit output DO that is used for reading.

BIST memory has some special inputs: 1-bit input INITIALIZE, 2-bit input INITIAL_STATE, 2-bit input TARGET_STATE, 1-bit input DIRECTION, and 1 bit input DIMENSION. The values on inputs RN, CN, INITIAL_STATE, TARGET_STATE, DIMENSION, and DIRECTION are changed very seldom. Each change of any of these parameters is made in parallel with setting the input INITIALIZE equal to 1. All the other times (if values of inputs RN, CN, INITIAL_STATE, TARGET_STATE, DIMENSION, and DIRECTION are not changed) the value of the input INITIALIZE is 0.

All the bits stored in the memory are lexicographically ordered. The order depends on the values of the inputs DIMENSION and DIRECTION. For example, (ROW1, COL1) and (ROW2,COL2) are some bit addresses (called points). (ROW1,COL1)<(ROW2,COL2) if and only if:
  (ROW1<ROW2) or ((ROW1=ROW2) and (COL1<COL2)) if DIMENSION=0 DIRECTION=0,
  (ROW1>ROW2) or ((ROW1=ROW2) and (COL2>COL1)) if DIMENSION=0 DIRECTION=1,
  (COL1<COL2) or ((COL1=COL2) and (ROW1<ROW2)) if DIMENSION=1 DIRECTION=0,
  (COL1>COL2) or ((COL1=COL2) and (ROW1>ROW2)) if DIMENSION=1 DIRECTION=1.

For each pair of points (ROW1,COL1) and (ROW2, COL2) the distance D((ROW1,COL1),(ROW2,COL2)) between these points is defined to be one plus the number of points that are between (ROW1,COL1) and (ROW2,COL2) in the lexicographical order if these are different points, and zero if the two points are the same point.

For each point (ROW,COL) and each k=0, ±1, ±2, ±3, . . . the $k^{th}$ neighbor N(row,col,k) of the point (ROW,COL) is defined to be:
  if k=0, then N(ROW,COL,k)=(ROW,COL);
  if k>0, then N(ROW,COL,k)=(ROW2,COL2), such that (ROW,COL)<(ROW2,COL2) and D((ROW,COL), (ROW2,COL2)=k;
  if k<0, then N(ROW,COL,k)=(ROW1,COL1), such that (ROW,COL)>(ROW1,COL1) and D((ROW,COL), (ROW1,COL1)=–k.

The neighbor N(ROW,COL,k) may not exist for some ROW,COL, and k. NE(ROW,COL,k)=1 if N(ROW,COL,k) exists, and =0 if this neighbor does not exist.

To illustrate the definitions some examples are considered where RN=3 and CN=4.
  If DIMENSION=0 and DIRECTION=0 then the lexicographical order is the following order: (0,0)<(0,1)<(0, 2)<(0,3)<(1,0)<(1,1)<(1,2)<(1,3)<(2,0)<(2,1)<(2,2)< (2,3). D((2,0),(2,3))=3, D((2,0),(1,3))=1, D((2,0),(0, 3))=5. N((2,0),0)=(2,0), N((2,0),1)=(2,1), N((2,0),2)= (2,2), N((2,0),3)=(2,3), N((2,0),4) does not exist. N((2, 0),– 1)=(1,3), N((2,0),–2)=(1,2), . . . , N((2,0),–8)=(0, 0), N((2,0),–9) does not exist.
  If DIMENSION=1, DIRECTION=0, then the order is: (0,0)<(1,0)<(2,0)<(0,1)<(1,1)<(2,1)<(0,2)<(1,2)<(2, 2)<(0,3)<(1,3)<(2,3).
  If DIMENSION=0, DIRECTION=1, then the order is: (2,3)<(2,2)<(2,1)<(2,0)<(1,3)<(1,2)<(1,1)<(1,0)<(0, 3)<(0,2)<(0,1)<(0,0).
  If DIMENSION=0, DIRECTION=0, then the order is: (2,3)<(1,3)<(0,3)<(2,2)<(1,2)<(0,2)<(2,1)<(1,1)<(0, 1)<(2,0)<(1,0)<(0,0).

The values that are stored in the memory can be determined by the triple (CENTER_ROW, CENTER_COL, EXTRA_VALUES), where CENTER_ROW and CENTER_COL are some row number and some column number, $0<=$CENTER_ROW$<$RN, $0<=$CENTER_COL$<$CN. The EXTRA_VALUES are the values of bits whose addresses belong to some local area around the point (CENTER_ROW, CENTER_COL). An example is used to define the phrase "local area around the point (CENTER_ROW, CENTER_COL)." In the given invention we consider two types of local areas: RECT (rectangular) and LINE (linear). In accordance with the type of the local area we designate BIST memory as RECT BIST memory (RBM) and LINE BIST memory (LBM) accordingly. The variable W is defined to be a radius of the local area. Usually W=1 or 2.

The RECT local area is the set of points (ROW,COL) such that |ROW−CENTER_ROW|$<=$W and |COL−CENTER_COL|$<=$W. It is easy to understand that the number of points in the RECT local area equals $(2W+1)*(2W+1)$. The EXTRA_VALUES of the RBM are defined by the matrix $(2W+1)\times(2W+1)$: $\{e_{i,j}\}$, $-W<=i,j<=W$, where $e_{i,j}$ is a value stored at address (CENTER_ROW+i,CENTER_COL+j).

The LINE local area is the set of points (ROW,COL) such that $D((ROW,COL),(CENTER\_ROW, CENTER\_COL))<=W$. It is easy to understand that the number of points in the LINE local area equals $(2W+1)$. The EXTRA_VALUES of the LBM are defined by a vector of $(2W+1)$ bits: $\{e_i\}$, $-W<=i<=W$, where $e_i$ is a value stored at address N(CENTER_ROW, CENTER_COL,i).

For each point (ROW,COL) set P(ROW,COL)=(ROW+COL)(mod 2). P(ROW,COL) can take two values only: 0 or 1.

All the values that are stored in the BIST memory can be determined by the triple (CENTER_ROW, CENTER_COL, EXTRA_VALUES). For each point (ROW,COL) the value that is stored in the BIST memory at address (ROW,COL) is defined in accordance with the following rules:

if (ROW,COL) belongs to local area then the value stored in memory equals to the corresponding value in the EXTRA_VALUES set, if (ROW,COL)<(CENTER_ROW,CENTER_COL) then stored value=INITIAL_STATE[P(ROW,COL)]

if (ROW,COL)>(CENTER_ROW,CENTER_COL) then stored value=TARGET_STATE[P(ROW,COL)].

The memory can take the described states only, and even then not all the writing operations are legal. Writing some "bad" values to some "bad" addresses may be illegal and make the BIST memory not fulfill the rules described above. The BIST memory has a 1-bit output error flag that equals 1 if there was an illegal write operation in the BIST memory, and equals 0 if all write operations were legal.

Now we are ready to specify the total set of inputs and outputs of the BIST memory:

module BIST_MEMORY(RN, CN, INITIAL_STATE, TARGET_STATE,
INITIALIZE, DIMENSION, DIRECTION, DI, WE, READ_ROW,
READ_COL, WRITE_ROW, WRITE_COL, DO, ERROR);
input [S-1:0] RN, [S-1:0] CN;
input [1:0] INITIAL_STATE, [1:0] TARGET_STATE;
input INITIALIZE;
input DIMENSION, DIRECTION;
input DI, WE;
input [S-1:0] READ_ROW, [S-1:0] READ_COL, [S-1:0] WRITE_ROW, [S-1:0] WRITE_COL;
output DO, ERROR;
endmodule The rules that replace storing all RN*CN values with storing triple (CENTER_ROW, CENTER_COL, EXTRA_VALUES) make it possible to implement the BIST memory using flipflops and logical cells instead of the usual memory. In the given invention we propose the construction of RBM and LBM memories from flipflops and logic cells only. The modules constructed by these methods have a smaller area and better timing in comparison with the usual memories.

Before providing a description of these design methods, the function V((ROW1,COL1),(ROW2,COL2)) is defined such that:

V((ROW1,COL1),(ROW2,COL2))=INITIAL_STATE[P(ROW2,COL2)], if (ROW2,COL2)$<=$(ROW1,COL1);

V((ROW1,COL1),(ROW2,COL2))=TARGET_STATE[P(ROW2,COL2)], if (ROW2,COL2)>(ROW1,COL1).

LBM Module

The LBM module contains the following registers (flip-flops):

S-bit register CENTER_ROW;
S-bit register CENTER_COL;
$(2W+1)$ 1-bit registers $e_i$ $(-W<=i<=W)$ that stores the value of the point N((CENTER_ROW,CENTER_COL),i).

To organize the read operation (or to evaluate the value of the output DO), the following calculations are used. Point (READ_ROW,READ_COL) is compared with points N((CENTER_ROW,CENTER_COL),i) for each i, $(-W<=i<=W)$, such that NE((CENTER_ROW,CENTER_COL),i)=1. If (READ_ROW,READ_COL)=N((CENTER_ROW,CENTER_COL),i) for some i, then DO=$e_i$, otherwise DO=V((CENTER_ROW,CENTER_COL),(READ_ROW, READ_COL)).

The method for synthesis of the part of the LBM that is responsible for the write operations (or the evaluation of the value of the output ERROR and the evaluation of the new values of the registers when a write operation is executed) is based on the following theorem.

Theorem. Let (CENTER_ROW, CENTER_COL, EXTRA_VALUES) be the current state of the LBM. Apply the write operation to this memory (WE=1) such that the new value DI that is written in to point (WRITE_ROW, WRITE_COL) does not equal the value that is currently written at this point. Then the following two statements are valid:

1. If INITIAL_STATE≠TARGET_STATE, then the write operation is valid only if D((CENTER_ROW,CENTER_COL),(WRITE_ROW,WRITE_COL))$<=$3+3W.
2. If the write operation is legal, then the state of the LBM after the write can be defined by some triple (NEW_CENTER_ROW,NEW_CENTER_COL,NEW_EXTRA_VALUES) such that:
(NEW_CENTER_ROW,NEW_CENTER_COL)=(CENTER_ROW,CENTER_COL) if point (WRITE_ROW, WRITE_COL) belongs to local area;
(NEW_CENTER_ROW,NEW_CENTER_COL)=N((WRITE_ROW,WRITE_COL),W) if point (WRITE_ROW,WRITE_COL) does not belong to local area and (CENTER_ROW,CENTER_COL)>(WRITE_ROW, WRITE_COL);

(NEW_CENTER_ROW,NEW_CENTER_COL)=N
((WRITE_ROW,WRITE_COL),-W) if point (WRITE_ROW,WRITE_COL) does not belong to local area and
(CENTER_ROW,CENTER_COL)<(WRITE_ROW WRITE_COL).

Statement 2 of the theorem describes how to evaluate the new values of the registers CENTER_ROW and CENTER_COL when a write operation is executed.

Statement 1 of the theorem highly simplifies the algorithm of evaluation of the value of the output ERROR and the new values of the registers $e_i$. Moreover, this algorithm can be easily implemented as a logical module:

a. Define parameter Q=3+3W.
b. Assign ERROR=0.
c. If D((CENTER_ROW,CENTER_COL),(WRITE_ROW, WRITE_COL))<=Q, then go to step g).
d. If INITIAL_STATE≠TARGET_STATE then ERROR=1, go to step k).
e. If there is some i such that -W<=i<=W, NE((CENTER_ROW,CENTER_COL),i)=1 and $e_i$≠V((CENTER_ROW, CENTER_COL),N((CENTER_ROW,CENTER_COL), i)), then ERROR=1, go to step k).
f. Assign (NEW_CENTER_ROW,NEW_CENTER_COL)= (WRITE_ROW,WRITE_COL), go to step i).
g. Evaluate (NEW_CENTER_ROW,NEW_CENTER_COL) as it is described in statement 2 of the theorem.
h. For each point POINT=N((CENTER_ROW,CENTER_COL),j) where -Q<=j<=Q and NE((CENTER_ROW, CENTER_COL),j)=1 that does not belong to the set of points {N((NEW_CENTER_ROW,NEW_CENTER_COL),i)|-W<=i<=W}, check if V((CENTER_ROW, CENTER_COL),POINT)=V((NEW_CENTER_ROW, NEW_CENTER_COL),POINT). If NO, then ERROR=1, go to step k).
i. For each point POINT=N((NEW_CENTER_ROW,NEW_CENTER_COL),i) where -W<=i<=W and NE((NEW_CENTER_ROW,NEW_CENTER_COL),i)=1 assign the new value of register new_$e_i$, if POINT=N((CENTER_ROW,CENTER_COL),j) for some j, -W<=j<=W, then new_$e_i$=$e_j$, otherwise new_$e_i$=V((CENTER_ROW,CENTER_COL),POINT).
j. Assign the new values of the registers CENTER_ROW=NEW_CENTER_ROW,CENTER_COL=NEW_CENTER_COL, $e_i$=new_$e_i$, -W<=i<=W.
k. Finish the algorithm.

RBM Module

In contrast to the LBM module described above, the triple (CENTER_ROW,CENTER_COL,EXTRA_VALUES) is not implemented in registers or flipflops. Define the parameter R=2*W*W+2*W+1. The RBM module contains the following registers (it can be proven that these registers fully describe the state of the RBM if this state is legal):

The R minimal possible points $(COL_{1,1}, ROW_{1,1})$< $(ROW_{1,2}, COL_{1,2})$< ... <$(ROW_{1,R}, COL_{1,R})$ which store values that are not equaled to initial_state[P(Row,Col)]. We will call these points extra-points of type 1.

The R maximal possible points $(COL_{2,1}, ROW_{2,1})$> $(ROW_{2,2}, COL_{2,2})$> ... >$(ROW_{2,R}, COL_{2,R})$ which store values that are not equaled to TARGET_STATE[P(ROW,COL)]. We will call these points extra-points of type 2.

Define $EXTRA_{i,j}=(COL_{i,j}, ROW_{i,j})$, i=1, 2, j=1, 2, ..., R. Note that it is not guaranteed that all R extra-points of type 1 or 2 must exist. There can be situations when less than R extra-points of some type exist. We use the following registers to make these situations clear: Registers $K_i$, i=1, 2, that can take the value 0, 1, ... R, which are the numbers of existing extra-points of type i.

Now we explain how to evaluate the values of outputs DO and ERROR after read/write operations, and how to reevaluate the values of registers after write operations.

RBM Read (DO Evaluation)

a. Read RBM at address (READ_ROW,READ_COL). Define POINT=(READ_ROW,READ_COL).
b. If $K_1$=0, then DO=INITIAL_STATE[P(POINT)], go to step f).
c. If POINT>$EXTRA_{1,K1}$, then go to step e).
d. Compare POINT with all extra-points $EXTRA_{1,j}$ of type 1, j=1, 2, ..., $K_1$. If POINT=$EXTRA_{1,j}$ for some j then DO=1-INITIAL_STATE[P(POINT)]. Otherwise DO=INITIAL_STATE[P(POINT)]. Go to step f).
e. Compare POINT with all extra-points $EXTRA_{2,j}$ of type 2, j=1, 2, ..., $K_2$. If POINT=$EXTRA_{2,j}$ for some j then DO=1-TARGET_STATE[P(POINT)]. Otherwise DO=TARGET_STATE[P(POINT)].
f. Finish the algorithm.

RBM Write (Registers $EXTRA_{i,j}$ and $K_i$ Evaluation)

This algorithm uses the following theorem: If RBM is in the legal state and $K_i$=R and (R+1)-th extra-point $EXTRA_{i,R+1}$ of type i (i=1, 2) exists then $D(EXTRA_{i,R}, EXTRA_{i,R+1})$<=3*R.

a. Write (WE=1) with the value DI to RBM at address (WRITE_ROW,WRITE_COL). Define POINT= (WRITE_ROW,WRITE_COL).
b. If DI=INITIAL_STATE[P(POINT)], then go to step d).
c. Create a new set of extra points of type 1 as follows: $NEW\_EXTRA\_SET_1$={POINT}∪{$EXTRA_{1,j}$|j=1, 2, ..., $K_1$}. If the number of elements of this set is more than R (it can be (R+1) only), then remove the largest element of this set. Assign the remaining elements of the set $NEW\_EXTRA\_SET_1$ in lexicographical order to registers $EXTRA_{1,j}$ and set the value of the register $K_1$ to be the number of elements of the set $NEW\_EXTRA\_SET_1$. Go to step f).
d. If POINT≠$EXTRA_{1,j}$ for each j, j=1, 2, ..., $K_1$, then go to step f). If POINT=$EXTRA_{1,j}$ for some j, then $EXTRA_{1,x-1}=EXTRA_{1,x}$ for each x=j+1, j+2, ... $K_1$. If $K_1$<R, then $K_1=K_1-1$, go to step f).
e. Find the minimal possible t∈{1, 2, ... 3*R} such that the value stored at address $N(EXTRA_{1,R},t)$ does not equal INITIAL_STATE[P($N(EXTRA_{1,R},t)$)]. If such a t is found, then $EXTRA_{1,R}=N(EXTRA_{1,R},t)$. Otherwise $K_1=K_1-1$.
f. If DI=TARGET_STATE[P(POINT)], then go to step h).
g. Create a new set of extra points of type 2 as follows: $NEW\_EXTRA\_SET_2$={POINT}∪{$EXTRA_{2,j}$|j=1, 2, ..., $K_2$}. If the number of elements of this set is more than R (it can be (R+1) only), then remove the smallest element of this set. Assign the remaining elements of the set $NEW\_EXTRA\_SET_2$ in back lexicographical order to registers $EXTRA_{2,j}$ and set the value of the register $K_2$ to be the number of elements of the set $NEW\_EXTRA\_SET_2$. Go to step j).
h. If POINT≠$EXTRA_{2,j}$ for each j, j=1, 2, ..., $K_2$, then go to step j). If POINT=$EXTRA_{2,j}$ for some j, then $EXTRA_{2,x-1}=EXTRA_{2,x}$ for each x=j+1, j+2, ... $K_2$. If $K_2$<R, then $K_2=K_2-1$, go to step j).
i. Find the minimal possible t∈{1, 2, ... 3*R} such that the value stored at address $N(EXTRA_{2,R},-t)$ does not equal TARGET_STATE[P(N(EXTRA$_{2,R}$,-t))]. If such a t is found, then EXTRA$_{2,R}$=N(EXTRA$_{2,R}$,-t). Otherwise K$_2$=K$_2$-1.

j. Finish the algorithm.

RBM Error Checking (ERROR Evaluation)
a. Initially ERROR=1.
b. If K$_1$=0 or K$_2$=0 then ERROR=0, go to step h).
c. For each pair (j1,j2) such that j1=1, 2, . . . , K$_1$, j2=1, 2, . . . , K$_2$, execute steps d)-g).
d. If (EXTRA$_{2,j2}$>EXTRA$_{1,j1}$), then go to step g).
e. Create a set of points EXTRA_SET$_{j1,j2}$={EXTRA$_{1,j}$|j=1, 2, . . . , j1}∪{EXTRA$_{2,j}$|j=1, 2, . . . , j2}.
f. If at least one of the two sets EXTRA_SET$_{j1,j2}$\{EXTRA$_{1,j1}$} and EXTRA_SET$_{j1,j2}$\{EXTRA$_{2,j2}$} can be covered by some local area with some center (CENTER_ROW,CENTER_COL), then ERROR=0, go to step h).
g. Proceed with the next pair (j1,j2).
h. Finish the algorithm.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. In an RRAM design having linear BIST memory and rectangular BIST memory, an improvement comprising at least one of the linear BIST memory and the rectangular BIST memory formed only of flipflops and logic cells.

2. The RRAM design of claim 1, wherein both of the linear BIST memory and the rectangular BIST memory are formed only of flipflops and logic cells.

3. A method of read testing rectangular BIST memory in an RRAM design having linear BIST memory and rectangular BIST memory, where at least one of the linear BIST memory and rectangular BIST memory is formed only of flipflops and logic cells, the method comprising the steps of:
   a. read RBM at address (READ_ROW,READ_COL), define POINT=(READ_ROW,READ_COL),
   b. if K$_1$=0, then DO=INITIAL_STATE[P(POINT)], go to step f,
   c. if POINT>EXTRA$_{1,K1}$, then go to step e,
   d. Compare POINT with all extra-points EXTRA$_{1,j}$ of type 1, j=1, 2, . . . , K$_1$, if POINT=EXTRA$_{1,j}$ for some j then DO=1-INITIAL_STATE[P(POINT)], otherwise DO=INITIAL_STATE[P(POINT)], go to step f,
   e. compare POINT with all extra-points EXTRA$_{2,j}$ of type 2, j=1, 2, . . . , K$_2$ if POINT=EXTRA$_{2,j}$ for some j then DO=1-TARGET_STATE[P(POINT)], otherwise DO=TARGET_STATE[P(POINT)], and
   f. method complete.

4. A method of write testing rectangular BIST memory in an RRAM design having linear BIST memory and rectangular BIST memory, where at least one of the linear BIST memory and rectangular BIST memory is formed only of flipflops and logic cells, the method comprising the steps of:
   a. write (WE=1) with the value DI to RBM at address (WRITE_ROW,WRITE_COL), define POINT=(WRITE_ROW,WRITE_COL),
   b. if DI=INITIAL_STATE[P(POINT)], then go to step d,
   c. create a new set of extra points of type 1 as follows: NEW_EXTRA_SET$_1$={POINT}∪{EXTRA$_{1,j}$|j=1, 2, . . . , K$_1$}, if the number of elements of this set is more than R (it can be (R+1) only), then remove the largest element of this set, assign the remaining elements of set NEW_EXTRA_SET$_1$ in lexicographical order to registers EXTRA$_{1,j}$ and set register K$_1$ to be the number of elements of set NEW_EXTRA_SET$_1$, go to step f,
   d. if POINT≠EXTRA$_{1,j}$ for each j, j=1, 2, . . . , K$_1$, then go to step f, if POINT=EXTRA$_{1,j}$ for some j, then EXTRA$_{1,x-1}$=EXTRA$_{1,x}$ for each x=j+1, j+2, . . . K$_1$. If K$_1$<R, then K$_1$=K$_1$-1, go to step f,
   e. find the minimal possible t∈{1, 2, . . . 3*R} such that a value stored at address N(EXTRA$_{1,R}$,t) does not equal INITIAL_STATE[P(N(EXTRA$_{1,R}$,t))], if such a t is found, then EXTRA$_{1,R}$=N(EXTRA$_{1,R}$,t), otherwise K$_1$=K$_1$-1,
   f. if DI=TARGET_STATE[P(POINT)], then go to step h,
   g. create a new set of extra points of type 2 as follows: NEW_EXTRA_SET$_2$={POINT}∪{EXTRA$_{2,j}$|j=1, 2, . . . , K$_2$}, if the number of elements of this set is more than R (it can be (R+1) only), then remove the smallest element of this set, and assign the remaining elements of set NEW_EXTRA_SET$_2$ in back lexicographical order to registers EXTRA$_{2,j}$ and set register K$_2$ to be the number of elements of set NEW_EXTRA_SET$_2$, go to step j,
   h. if POINT≠EXTRA$_{2,j}$ for each j, j=1, 2, . . . , K$_2$, then go to step j, if POINT=EXTRA$_{2,j}$ for some j, then EXTRA$_{2,x-1}$=EXTRA$_{2,x}$ for each x=j+1, j+2, . . . K$_2$. If K$_2$<R, then K$_2$=K$_2$-1, go to step j,
   i. find the minimal possible t∈{1, 2, . . . 3*R} such that a value stored at address N(EXTRA$_{2,R}$,-t) does not equal TARGET_STATE[P(N(EXTRA$_{2,R}$,-t))], if such a t is found, then EXTRA$_{2,R}$=N(EXTRA$_{2,R}$,-t), otherwise K$_2$=K$_2$-1, and
   j. method complete.

5. A method of error testing rectangular BIST memory in an RRAM design having linear BIST memory and rectangular BIST memory, where at least one of the linear BIST memory and rectangular BIST memory is formed only of flipflops and logic cells, the method comprising the steps of:
   a. initially ERROR=1,
   b. if K$_1$=0 or K$_2$=0 then ERROR=0, go to step h,
   c. for each pair (j1,j2) such that j1=1, 2, . . . , K$_1$, j2=1, 2, . . . , K$_2$, execute steps d through g,
   d. if (EXTRA$_{2,j2}$>EXTRA$_{1,j1}$), then go to step g,
   e. create a set of points EXTRA_SET$_{j1,j2}$={EXTRA$_{1,j}$|j=1, 2, . . . , j1}∪{EXTRA$_{2,j}$|j=1, 2, . . . , j2},
   f. if at least one of the sets EXTRA_SET$_{j1,j2}$\{EXTRA$_{1,j1}$} and EXTRA_SET$_{j1,j2}$\{EXTRA$_{2,j2}$} can be covered by some local area with some center (CENTER_ROW,CENTER_COL), then ERROR=0, go to step h,
   g. proceed with the next pair (j1,j2), and
   h. method complete.

6. A method of error testing linear BIST memory in an RRAM design having linear BIST memory and rectangular BIST memory, where at least one of the linear BIST memory and rectangular BIST memory is formed only of flipflops and logic cells, method comprising the steps of:

a. define parameter Q=3+3W,
b. assign ERROR=0,
c. if D((CENTER_ROW,CENTER_COL),(WRITE_ROW,WRITE_COL))<=Q, then go to step g,
d. if INITIAL_STATE≠TARGET_STATE then ERROR=1, go to step k,
e. if there is some i such that −W<=i<=W, NE((CENTER_ROW,CENTER_COL),i)=1 and $e_i$≠V((CENTER_ROW,CENTER_COL),N((CENTER_ROW,CENTER_COL),i)), then ERROR=1, go to step k,
f. assign (NEW_CENTER_ROW,NEW_CENTER_COL)=(WRITE_ROW,WRITE_COL), go to step i,
g. evaluate (NEW_CENTER_ROW,NEW_CENTER_COL) by,
 i. (NEW_CENTER_ROW,NEW_CENTER_COL)=(CENTER_ROW,CENTER_COL) if point (WRITE_ROW,WRITE_COL) belongs to local area,
 ii. (NEW_CENTER_ROW,NEW_CENTER_COL)=N((WRITE_ROW,WRITE_COL),W) if point (WRITE_ROW,WRITE_COL) does not belong to local area and (CENTER_ROW,CENTER_COL)>(WRITE_ROW,WRITE_COL), and
 iii. (NEW_CENTER_ROW,NEW_CENTER_COL)=N((WRITE_ROW,WRITE_COL),−W) if point (WRITE_ROW,WRITE_COL) does not belong to local area and (CENTER_ROW,CENTER_COL)<(WRITE_ROW,WRITE_COL),
h. for each point POINT=N((CENTER_ROW,CENTER_COL),j) where −Q<=j<=Q and NE((CENTER_ROW,CENTER_COL),j)=1 that does not belong to the set of points {N((NEW_CENTER_ROW,NEW_CENTER_COL),i)|−W<=i<=W}, check if V((CENTER_ROW,CENTER_COL),POINT)=V((NEW_CENTER_ROW,NEW_CENTER_COL),POINT). If NO, then ERROR=1, go to step k,
i. for each point POINT=N((NEW_CENTER_ROW,NEW_CENTER_COL),i) where −W<=i<=W and NE((NEW_CENTER_ROW,NEW_CENTER_COL),i)=1, assign a new value of register new_$e_i$, if POINT=N((CENTER_ROW,CENTER_COL),j) for some j, −W<=j<=W, then new_$e_i$=$e_j$, otherwise new_$e_i$=V((CENTER_ROW,CENTER_COL),POINT),
j. assign new values of the registers CENTER_ROW=NEW_CENTER_ROW, CENTER_COL=NEW_CENTER_COL, $e_i$=new_$e_i$, and −W<=i<=W, respectively, and
k. method complete.

* * * * *